(12) United States Patent
Leng

(10) Patent No.: US 12,021,115 B2
(45) Date of Patent: Jun. 25, 2024

(54) METAL-INSULATOR-METAL (MIM) CAPACITOR MODULE WITH DIELECTRIC SIDEWALL SPACER

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 162 days.

(21) Appl. No.: 17/749,367

(22) Filed: May 20, 2022

(65) Prior Publication Data

US 2023/0268380 A1    Aug. 24, 2023

Related U.S. Application Data

(60) Provisional application No. 63/312,917, filed on Feb. 23, 2022.

(51) Int. Cl.
*H10B 12/00* (2023.01)
*H01L 49/02* (2006.01)

(52) U.S. Cl.
CPC .............. *H01L 28/91* (2013.01); *H01L 28/92* (2013.01); *H10B 12/038* (2023.02); *H10B 12/0387* (2023.02); *H10B 12/37* (2023.02); *H01L 28/75* (2013.01)

(58) Field of Classification Search
CPC .......... H01L 28/90–92; H01L 23/5223; H10B 12/038; H10B 12/0387; H10B 12/37
See application file for complete search history.

(56) References Cited

U.S. PATENT DOCUMENTS

| | | |
|---|---|---|
| 2003/0129799 A1 | 7/2003 | Nam et al. ..................... 438/253 |
| 2007/0057306 A1* | 3/2007 | Nakamura .............. H01L 28/65 |
| | | 257/E27.088 |
| 2021/0043560 A1 | 2/2021 | Leng |
| 2021/0265263 A1 | 8/2021 | Leng |

FOREIGN PATENT DOCUMENTS

| | | | | |
|---|---|---|---|---|
| EP | 1022783 A2 | 7/2000 | ............. | H01L 21/02 |
| WO | 2013/089711 A1 | 6/2013 | ......... | H01L 21/8242 |

OTHER PUBLICATIONS

International Search Report and Written Opinion, Application No. PCT/US2022/041164, 16 pages, Dec. 20, 2022.

* cited by examiner

*Primary Examiner* — Jose R Diaz
(74) *Attorney, Agent, or Firm* — SLAYDEN GRUBERT BEARD PLLC

(57) ABSTRACT

A metal-insulator-metal (MIM) capacitor includes a bottom electrode cup, an insulator cup, and a top electrode. The bottom electrode cup includes a laterally-extending bottom electrode cup base, and a bottom electrode cup sidewall extending upwardly from the laterally-extending bottom electrode cup base. The insulator cup is formed in an opening defined by the bottom electrode cup, and includes a laterally-extending insulator cup base formed over the laterally-extending bottom electrode cup base, and an insulator cup sidewall extending upwardly from the laterally-extending insulator cup base. A dielectric sidewall spacer is located between the insulator cup sidewall and the bottom electrode cup sidewall. The top electrode is formed in an opening defined by the insulator cup.

24 Claims, 12 Drawing Sheets

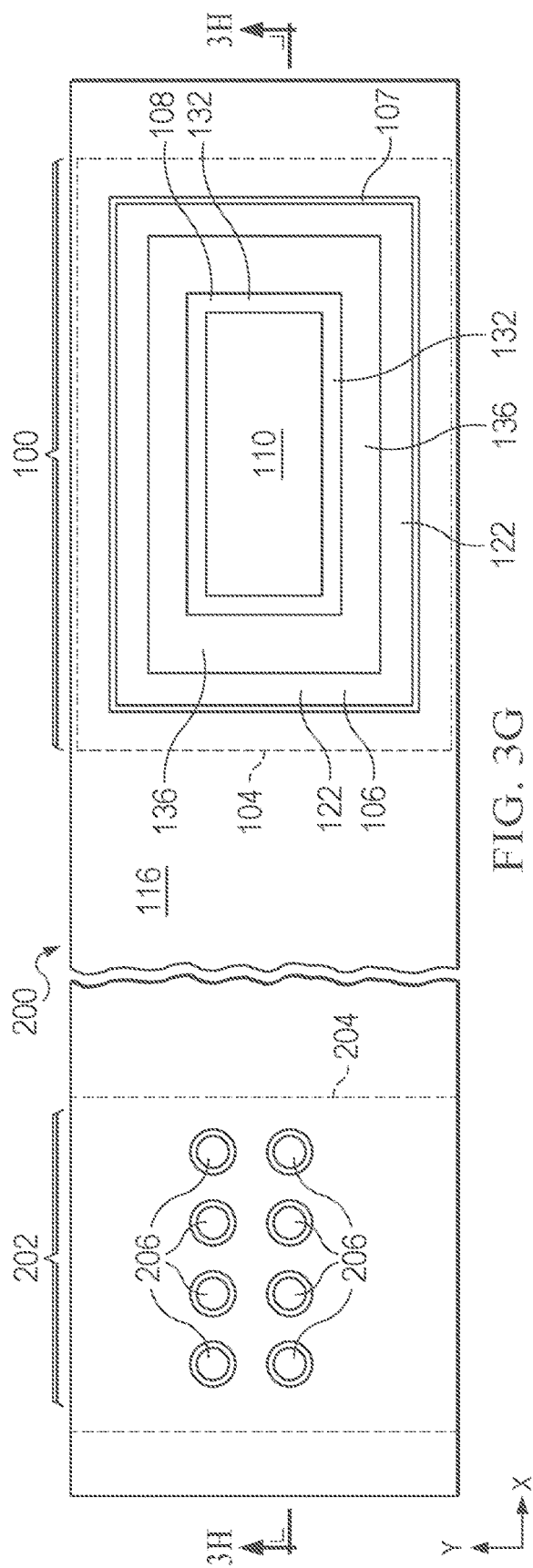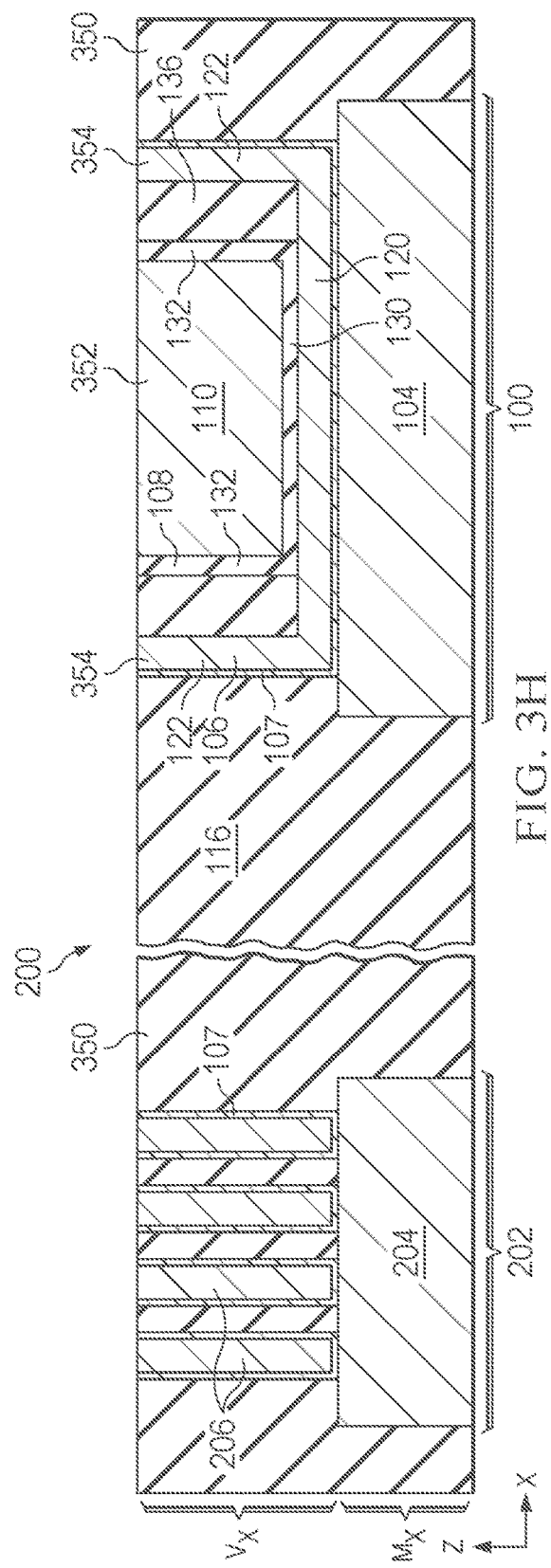

ABSTRACT

METAL-INSULATOR-METAL (MIM) CAPACITOR MODULE WITH DIELECTRIC SIDEWALL SPACER

RELATED PATENT APPLICATION

This application claims priority to commonly owned U.S. Provisional Patent Application No. 63/312,917 filed Feb. 23, 2022, the entire contents of which are hereby incorporated by reference for all purposes.

TECHNICAL FIELD

The present disclosure relates to integrated circuit components, and more particularly to metal-insulator-metal (MIM) capacitors formed in integrated circuits.

BACKGROUND

A metal-insulator-metal (MIM) capacitor is a capacitor constructed with a metal top electrode, a metal bottom electrode, and an insulator (dielectric) sandwiched between the two electrodes.

MIM capacitors are important components in many electrical circuits, for example many analog, mixed-signal, and radio-frequency complementary metal-oxide semiconductors (RF CMOS) circuits. MIM capacitors typically provide better performance than alternatives, such as POP (poly-oxide-poly) capacitors and MOM (metal-oxide-metal lateral flux) capacitors, due to lower resistance, better matching for analog circuits (e.g., matching device characteristics such as resistance and capacitance), and/or better signal/noise characteristics.

MIM capacitors are typically constructed between two interconnect metal layers (e.g., aluminum layers), referred to as metal layers $M_x$ and $M_{x+1}$. For example, an MIM capacitor may be formed using an existing metal layer $M_x$ as the bottom plate (bottom electrode), constructing an insulator and a top plate (top electrode) over the bottom electrode, and connecting an overlying metal layer $M_{x+1}$ to the top and bottom plates by respective vias. The top plate formed between the two metal layers $M_x$ and $M_{x+1}$ may be formed from a different metal than the metal layers $M_x$ and $M_{x+1}$. For example, the metal layers $M_x$ and $M_{x+1}$ may be formed from aluminum, whereas the top plate may be formed from titanium/titanium nitride (Ti/TiN), tantalum/tantalum nitride (Ta/TaN), or tungsten (W), for example.

The top electrode typically has a higher resistance than the bottom electrode, for example because the top electrode may be limited by thickness constraints and the material of choice, thus limiting the performance of conventional MIM capacitors. MIM capacitors typically have very narrow process margins, particularly for a metal etch used to form the top electrode.

Conventional MIM capacitors are also typically expensive to build. For example, MIM capacitors typically require multiple additional mask layers and many additional process steps.

In addition, for MIM capacitors formed in aluminum interconnect (i.e., where metal layers $M_x$ and $M_{x+1}$ comprise aluminum interconnect layers), the aluminum bottom electrode may be susceptible to hillock formation at a top side of the bottom electrode, e.g., resulting from high-temperature processing of aluminum, a low-melting-point metal. Hillocks formed on the bottom electrode may negatively or unpredictably affect the breakdown voltage of the MIM capacitor.

There is a need for MIM capacitors that can be manufactured at lower cost, with few or no added mask layers, and/or with improved breakdown voltage.

SUMMARY

A MIM capacitor module includes a bottom electrode including a bottom electrode cup, an insulator cup formed in the bottom electrode cup, and a top electrode formed in the insulator cup. The bottom electrode cup includes a laterally-extending bottom electrode cup base and a bottom electrode cup sidewall extending upwardly from the bottom electrode cup base. The insulator cup includes a laterally-extending insulator cup base formed over the bottom electrode cup base, and an insulator cup sidewall extending upwardly from the insulator cup base. The MIM capacitor module includes a dielectric sidewall spacer laterally between the insulator cup sidewall and bottom electrode cup sidewall. The dielectric sidewall spacer reduces a capacitive coupling between the top electrode and the bottom electrode cup sidewall (e.g., in a lateral direction). As a result, the MIM capacitor module effectively functions as a planar capacitor, defined by a capacitive coupling between the top electrode and the laterally-extending bottom electrode cup base, through the laterally-extending insulator cup base. The present MIM capacitor module may thus provide certain characteristics and/or advantageous associated with planar capacitors, e.g., as compared with "3D" MIM capacitors that utilize capacitive coupling between a top electrode and both a lateral base and a vertical sidewall of a cup-shaped bottom electrode. For example, the present MIM capacitor module may provide better matching for analog circuits (e.g., matching device characteristics such as resistance and capacitance), and/or higher breakdown voltage without suffering from an enhanced electric field at the corners.

As used herein, a "MIM capacitor module" includes the fundamental elements of an MIM capacitor, e.g., an insulator (dielectric) arranged between conductive electrodes (e.g., conductive plates), and may also include certain related elements, e.g., conductive elements providing electrical contact to the conductive electrodes, and in the examples disclosed herein, a dielectric sidewall spacer.

In addition, the lateral spacing (provided by the dielectric sidewall spacer) of the bottom electrode cup sidewall from the top electrode allows the formation of both a top electrode connection pad (formed on a top surface of the top electrode) and a bottom electrode connection pad (formed on a top surface of the bottom electrode cup sidewall) in a common (i.e., same) metal layer without the need for additional mask layers.

In some examples, the MIM capacitor module may be constructed concurrently with an interconnect structure. In some examples, the MIM capacitor module may be constructed using a damascene process without added photomask layers, as compared with a background IC fabrication process.

In some examples the MIM capacitor module provides a consistent breakdown voltage. For example, disclosed processes for forming the MIM capacitor module may avoid the presence of hillocks on the bottom electrode. In addition, the thickness of the top electrode and overlying top electrode connection pad (which, for example, can both be formed from aluminum) may be large, this providing a very low series resistance.

In some examples, the MIM capacitor module may be constructed between two metal interconnect layers, or between a silicided polysilicon layer and a metal-1 metal layer.

One aspect provides a MIM capacitor module including a bottom electrode cup, an insulator cup, and a top electrode. The bottom electrode cup includes a laterally-extending bottom electrode cup base, and a bottom electrode cup sidewall extending upwardly from the laterally-extending bottom electrode cup base. The insulator cup is formed in an opening defined by the bottom electrode cup, and includes a laterally-extending insulator cup base formed over the laterally-extending bottom electrode cup base, and an insulator cup sidewall extending upwardly from the laterally-extending insulator cup base. A dielectric sidewall spacer is located between the insulator cup sidewall and the bottom electrode cup sidewall. The top electrode is formed in an opening defined by the insulator cup.

In some examples, the laterally-extending insulator cup base covers only a partial area of the laterally-extending bottom electrode cup base, due to the presence of the dielectric sidewall spacer.

In some examples, the MIM capacitor module includes (a) a bottom electrode base formed in a lower metal layer, wherein the bottom electrode cup is formed on the bottom electrode base, and (b) a top electrode connection pad formed in an upper metal layer and conductively connected to the top electrode.

In some examples, the lower metal layer and the upper metal layer comprise respective interconnect metal layers. In other examples, the bottom electrode base comprises a metal silicide layer formed on a polysilicon structure.

In some examples, the MIM capacitor module includes a top electrode connection pad and a bottom electrode connection pad formed in an upper metal layer, wherein the top electrode connection pad is conductively connected to the top electrode, and wherein the bottom electrode connection pad is laterally spaced apart from the top electrode connection pad and conductively connected to the bottom electrode cup.

In some examples, the bottom electrode connection pad defines a closed-loop shape that surrounds the top electrode connection pad.

In some examples, the dielectric sidewall spacer comprises silicon oxide, fluorosilicate glass (FSG), organosilicate glass (OSG), or porous OSG.

In some examples, the dielectric sidewall spacer has a lateral thickness in the range of 2000 Å-5000 Å.

Another aspect provides an integrated circuit structure including an interconnect structure and a MIM capacitor module. The interconnect structure includes a lower interconnect element formed in a lower metal layer, an upper interconnect element formed in an upper metal layer, and an interconnect via formed in a dielectric region between the lower metal layer and the upper metal layer lower. The MIM capacitor module includes a bottom electrode cup base, a bottom electrode cup, an insulator cup, a dielectric sidewall spacer, and a top electrode. The bottom electrode cup base is formed in the lower metal layer. The bottom electrode cup includes a laterally-extending bottom electrode cup base, and a bottom electrode cup sidewall extending upwardly from the laterally-extending bottom electrode cup base. The insulator cup is formed in an opening defined by the bottom electrode cup, and includes a laterally-extending insulator cup base formed over the laterally-extending bottom electrode cup base, and an insulator cup sidewall extending upwardly from the laterally-extending insulator cup base. The dielectric sidewall spacer is located between the insulator cup sidewall and the bottom electrode cup sidewall. The top electrode is formed in an opening defined by the insulator cup.

In some examples, the integrated circuit structure includes a top electrode connection pad formed in the upper metal layer and conductively connected to the top electrode.

In some examples, the integrated circuit structure includes a bottom electrode connection pad formed in the upper metal layer and spaced apart from the top electrode connection pad, wherein the bottom electrode connection pad is conductively connected to the bottom electrode cup.

In some examples, the lower metal layer and the upper metal layer respectively comprise interconnect metal layers.

In some examples, the lower metal layer comprises a silicided polysilicon layer, wherein the lower interconnect element and the bottom electrode base comprise a respective metal silicide layer formed on a respective polysilicon structure.

Another aspect provides a method, including forming a tub opening in a dielectric region; depositing a conformal metal layer to form a bottom electrode cup in the tub opening, the bottom electrode cup including a laterally-extending bottom electrode cup base and a bottom electrode cup sidewall extending upwardly from the laterally-extending bottom electrode cup base; depositing a dielectric spacer layer extending into an opening defined by the bottom electrode cup; removing portions of the dielectric spacer layer to define a dielectric sidewall spacer laterally adjacent the bottom electrode cup sidewall; depositing an insulator layer to form an insulator cup, the insulator cup including a laterally-extending insulator cup base over the laterally-extending bottom electrode cup base and an insulator cup sidewall laterally adjacent the dielectric sidewall spacer, wherein the dielectric sidewall spacer is positioned laterally between the insulator cup sidewall and the bottom electrode cup sidewall; depositing a top electrode layer over the insulator layer, the top electrode layer extending into an opening defined by the insulator cup; and performing a planarization process to partially remove the top electrode layer, wherein a remaining portion of the top electrode layer defines a top electrode.

In some examples, the method includes forming a bottom electrode base in a lower metal layer, forming the dielectric region over the lower metal layer, forming the tub opening over the bottom electrode base, and forming a top electrode connection pad in an upper metal layer, wherein the top electrode connection pad is conductively connected to the top electrode.

In some examples, the method includes forming a bottom electrode connection pad in the upper metal layer, the bottom electrode connection pad spaced apart from the top electrode connection pad and conductively connected to the bottom electrode cup.

In some examples, the lower metal layer and the upper metal layer comprise respective interconnect metal layers. In other examples, the lower metal layer comprises a silicided polysilicon layer, wherein the bottom electrode base comprises a metal silicide layer formed on a polysilicon structure.

In some examples, the method includes forming a lower interconnect element in the lower metal layer, forming an interconnect via opening in the dielectric region, and depositing the conformal metal layer to form (a) the bottom electrode cup in the tub opening and (b) an interconnect via in the interconnect via opening.

In some examples, the deposited dielectric spacer layer defines a cup-shaped dielectric spacer layer structure including (a) a laterally-extending dielectric spacer layer region over the laterally-extending bottom electrode cup base and (b) a dielectric spacer layer sidewall extending upwardly from the laterally-extending dielectric spacer layer region; and selectively removing portions of the dielectric spacer layer comprises performing an anisotropic etch to remove the laterally-extending dielectric spacer layer region over the laterally-extending bottom electrode cup base.

In some examples, performing the planarization process comprises performing a chemical mechanical planarization (CMP) process to remove upper portions of the top electrode layer, insulator layer, dielectric spacer layer and conformal metal layer.

BRIEF DESCRIPTION OF THE DRAWINGS

Example aspects of the present disclosure are described below in conjunction with the figures, in which:

FIGS. 3A-3J show an example method of forming the example IC structure shown in FIG. 2, including a MIM capacitor module and interconnect structure.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
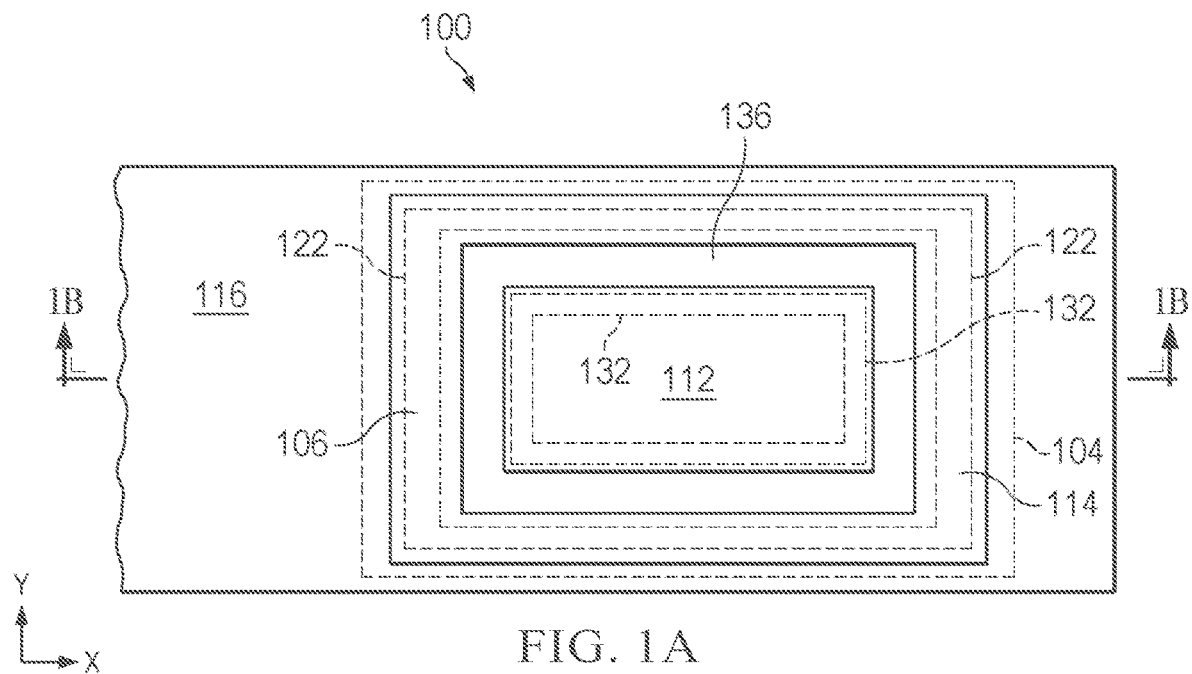
FIG. 1A is a top down view and FIG. 1B is a side cross-sectional view of an example MIM capacitor module.
Figure 1B:
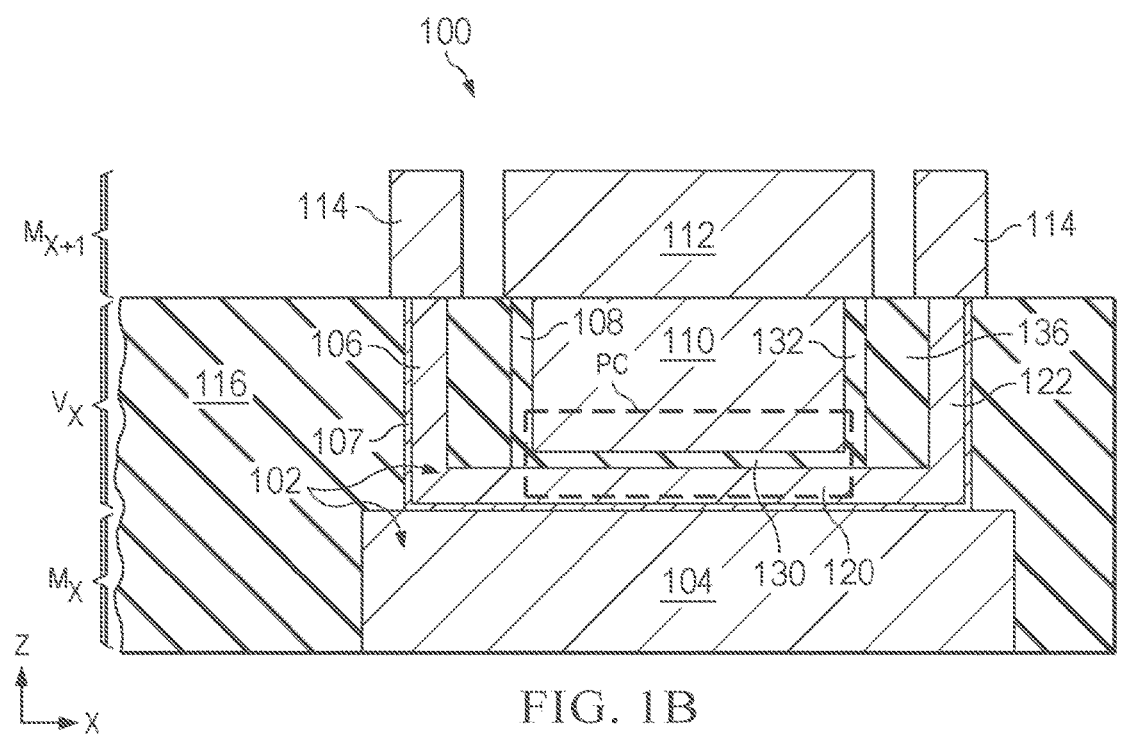

FIGS. 1A and 1B show an example MIM capacitor module 100 according to the present disclosure. In particular, FIG. 1A shows a top view of the MIM capacitor module 100, and FIG. 1B shows a side cross-sectional view of the MIM capacitor module 100 through cut line 1B-1B shown in FIG. 1A. As shown, the MIM capacitor module 100 includes (a) a bottom electrode 102 including a bottom electrode base 104 and a bottom electrode cup 106 formed over the bottom electrode base 104, (b) an insulator cup 108 formed in an opening defined by the bottom electrode cup 106, (c) a top electrode 110 formed in an opening defined by the insulator cup 108, (d) a top electrode connection pad 112 conductively connected to the top electrode 110, and (e) a bottom electrode connection pad 114 conductively connected to the bottom electrode cup 106.

In another example, the bottom electrode base 104 may be omitted; in such example, the bottom electrode cup 106 may be formed on an underlying dielectric region rather than being formed on the bottom electrode base 104 as shown in FIGS. 1A and 1B. For example, the bottom electrode cup 106 may be formed on an oxide region with the use of a suable etch stop layer to control a depth of a tub opening etch for a tub opening in which the bottom electrode cup 106 may be formed.

The bottom electrode base 104 may be formed in a lower metal layer $M_x$, for example a lower metal interconnect layer (e.g., an aluminum interconnect layer) or a silicided polysilicon layer, as discussed below in more detail.

The bottom electrode cup 106 may be formed in a dielectric region 116 (e.g., an Inter-Metal Dielectrics (IMD) region or a Poly-Metal Dielectrics (PMD) region), and includes (a) a laterally-extending bottom electrode cup base 120 and (b) a bottom electrode cup sidewall 122 extending upwardly from the laterally-extending bottom electrode cup base 120. In this example, the bottom electrode cup sidewall 122 extends upwardly from a lateral perimeter edge of the laterally-extending bottom electrode cup base 120. In some examples, the bottom electrode cup 106 is formed from tungsten (W) or other conformal metal. In some examples, the bottom electrode cup 106 is formed over a liner 107, e.g., comprising TiN.

The insulator cup 108 is formed in an opening defined by the bottom electrode cup 106, and includes (a) a laterally-extending insulator cup base 130 formed over at least a portion of the laterally-extending bottom electrode cup base 120 and (b) an insulator cup sidewall 132 extending upwardly from the laterally-extending insulator cup base 130. In this example, the insulator cup sidewall 132 extends upwardly from a lateral perimeter edge of the laterally-extending insulator cup base 130. In some examples, the insulator cup 108 comprises silicon nitride (SiN), e.g., with a thickness in the range of 250-750 Å. Alternatively, insulator cup 108 may comprise $Al_2O_3$, $ZrO_2$, $HfO_2$, $ZrSiO_x$, $HfSiO_x$, HfAlOx, or $Ta_2O_5$, or other suitable capacitor insulator material.

As shown in FIGS. 1A-1B, a dielectric sidewall spacer 136 may be formed between the insulator cup sidewall 132 and the bottom electrode cup sidewall 122, to substantially reduce a capacitive coupling between the top electrode 110 and the bottom electrode cup sidewall 122 (in the x-axis direction). In some examples, the dielectric sidewall spacer 136 comprises a silicon oxide, fluorosilicate glass (FSG), organosilicate glass (OSG), porous OSG, or other low-k dielectric (e.g., having a dielectric constant k less than 4.0), and may have a thickness (in the x-direction) in the range of 2000 Å-5000 Å. Those skilled in the art will recognize that the above-mentioned thicknesses may be equally applicable in the y-axis, as seen in FIG. 1A.

The top electrode 110 fills an interior opening defined by the insulator cup 108, and may comprise Al, Ti, TiN, W, or a combination thereof, for example a combination of TiN and Al, and may be deposited by a physical vapor deposition (PVD) process, for example.

The top electrode connection pad 112 and bottom electrode connection pad 114 may be formed in an upper metal layer $M_{x+1}$, e.g., a metal interconnect layer or a bond bad layer. The top electrode connection pad 112 and bottom electrode connection pad 114 may have any suitable shapes and sizes. For example, the top electrode connection pad 160 and bottom electrode connection pad 162 may respectively have a square or rectangular shape in an x-y plane, e.g., as shown in FIG. 1A. In another example (not shown) the top electrode connection pad 112 and bottom electrode connection pad 114 may respectively have a generally circular shape in the x-y plane. As another example, the top electrode connection pad 112 and/or bottom electrode connection pad 114 may respectively be substantially elongated, e.g., running laterally across the wafer in the x-direction and/or the y-direction. In some examples, the top electrode connection pad 112 and/or bottom electrode connection pad 114 may be omitted, and thus may be optional. For example, the bottom electrode connection pad 114 may be omitted, wherein the bottom electrode cup 106 or bottom electrode base 104 may be contacted from below or laterally from the side, instead of from above.

The top electrode 110 is capacitively coupled to the laterally-extending bottom electrode cup base 120 (laterally extending in the x-axis, and in the y-axis direction) through the laterally-extending insulator cup base 130 (laterally extending in the x-axis, and in the y-axis direction). As noted above, the dielectric sidewall spacer 136 substantially reduces a sidewall capacitive coupling between the top electrode 110 and bottom electrode cup sidewall 122. As a result, the structure of the MIM capacitor module 100 effectively defines a planar capacitor between the top electrode 110 and bottom electrode cup base 120 through the insulator cup base 130, generally indicated by the dashed line PC. This planar capacitor defined by the structure of MIM capacitor module 100 may be suitable or advantageous for particular applications, e.g., as compared with a 3D MIM capacitor in which the insulator cup sidewall 132 is formed directly adjacent bottom electrode cup sidewall 122 (i.e., omitting the dielectric sidewall spacer 136), resulting in capacitive coupling through both the insulator cup base 130 and the insulator cup sidewall 132. For example, a planar capacitor defined by the structure of MIM capacitor module 100 may provide better matching for analog circuits (e.g., matching device characteristics such as resistance and capacitance), and/or higher breakdown voltage without suffering from an enhanced electric field in the corners.

In addition, in some examples the dielectric sidewall spacer 136 provides a sufficient lateral spacing between the top electrode 110 and the bottom electrode cup sidewall 122 to allow formation of both the top electrode connection pad 112 (directly contacting a top surface of the top electrode 110) and bottom electrode connection pad 114 (directly contacting a top surface of the bottom electrode cup sidewall 122) in same metal layer $M_{x+1}$ without the need for additional mask layers.

In some examples, e.g., as discussed below, the MIM capacitor module 100 is constructed using a damascene process that adds no additional photomask operations to a background integrated circuit fabrication process.

In some examples, both the top electrode 110 and bottom electrodes base 104 are thick, e.g., having a thickness of at least 2500 Å in the z-direction, thus providing low resistance. In addition, the bottom electrode cup 106 may be formed from tungsten or other conformal refractory metal, and thus free of hillocks, which may provide consistent and high breakdown voltage for the MIM capacitor module 100.

Figure 2:
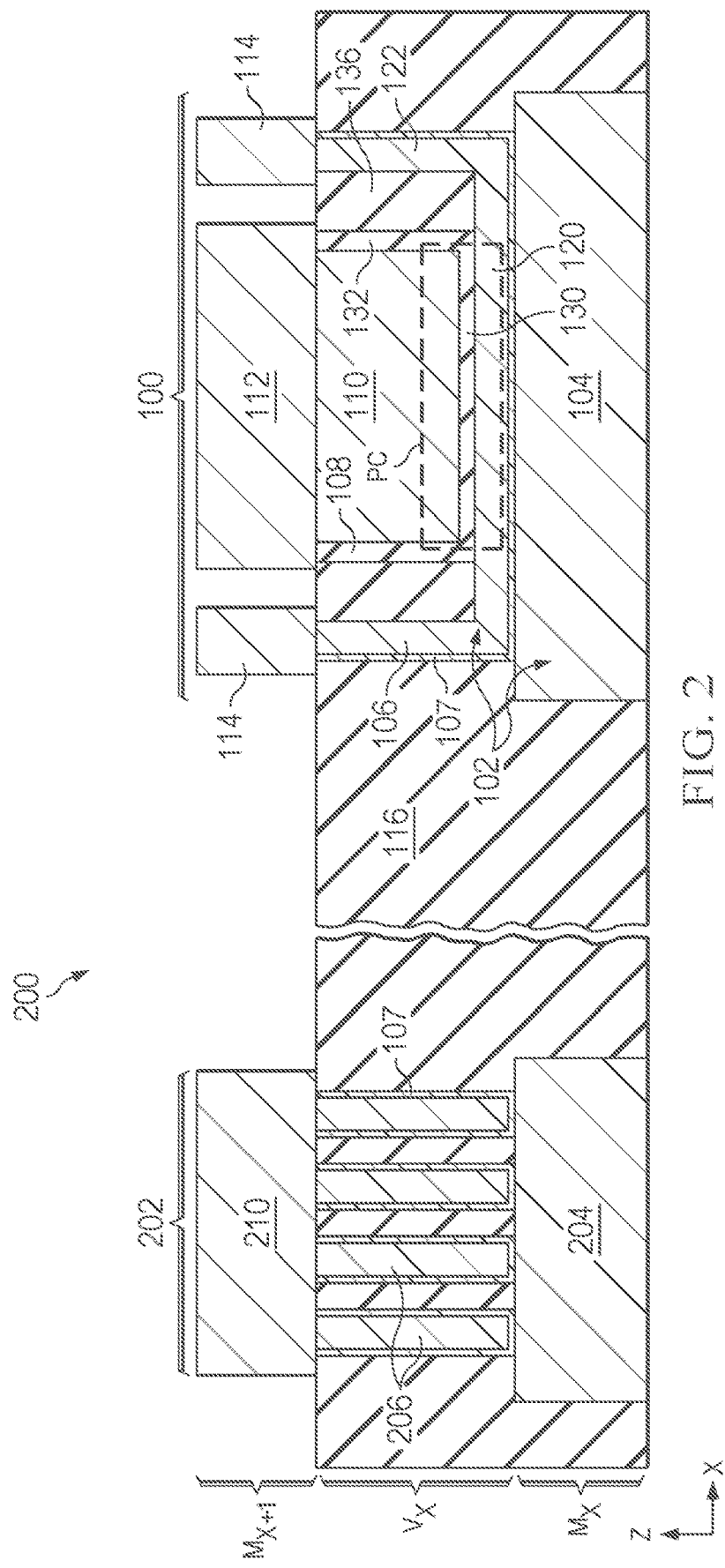
FIG. 2 is a side cross-sectional view showing an example IC structure including a MIM capacitor module and an interconnect structure, which may be formed concurrently, according to one example.

FIG. 2 is a side cross-sectional view showing an example IC structure 200 including the MIM capacitor module 100 shown in FIGS. 1A-1B and an interconnect structure 202 formed concurrently, according to one example. As mentioned above, the MIM capacitor module 100 may be constructed without adding any photomask operations to the background integrated circuit fabrication process (e.g., the background integrated circuit fabrication process for forming the interconnect structure 202 and/or other IC elements).

As discussed above, MIM capacitor module 100 includes bottom electrode 102 including bottom electrode base 104 and bottom electrode cup 106 including bottom electrode cup base 120 and bottom electrode cup sidewall 122, an insulator cup 108 including insulator cup base 130 and insulator cup sidewall 132, dielectric sidewall spacer 136 between bottom electrode cup sidewall 122 and insulator cup sidewall 132, top electrode 110, top electrode connection pad 112, and bottom electrode connection pad 114. As discussed above, the structure of the MIM capacitor module 100 (including the dielectric sidewall spacer 136 between the insulator cup sidewall 132 and bottom electrode cup sidewall 122) effectively defines a planar capacitor between the top electrode 110 and bottom electrode cup base 120 through the insulator cup base 130, generally indicated by the dashed line PC.

As shown in FIG. 2, the interconnect structure 202 may include a lower interconnect element 204 formed in a lower metal layer $M_x$ and an upper interconnect element 210 formed in an upper metal layer $M_{x+1}$ and connected to the lower interconnect element 204 by interconnect vias 206 formed in a via layer $V_x$, which interconnect vias 206 may be formed by depositing a conformal via material, e.g., tungsten, into respective via openings. In some examples, interconnect vias 206 are formed over liner 107, e.g., comprising TiN.

Each of the lower interconnect element 204 and upper interconnect element 210 may comprise a wire or other laterally elongated structure, or a discrete pad (e.g., having a square or substantially square shape from a top view), or any other suitable shape and structure.

As shown, the lower interconnect element 204 and bottom electrode base 104 may be formed in a lower metal layer $M_x$. The upper interconnect element 210, top electrode connection pad 112, and bottom electrode connection pad 114 may be formed in an upper metal layer $M_{x+1}$. The bottom electrode cup 106, insulator cup 108, dielectric sidewall spacer 136, and top electrode 110 may be formed in a via layer $V_x$ between the lower metal layer $M_x$ and upper metal layer $M_{x+1}$, e.g., using a damascene process as discussed below with respect to FIGS. 3A-3H.

As used herein, a "metal layer," for example in the context of lower metal layer $M_x$ and upper metal layer $M_{x+1}$, may comprise any metal or metalized layer or layers, including (a) a metal interconnect layer, e.g., comprising copper, aluminum or other metal deposited by a subtractive patterning process (e.g., deposition, patterning, and etching of a metal layer) or using a damascene process, or (b) a silicided polysilicon layer including a number of polysilicon regions each having a layer or region of metal silicide formed thereon, for example. For example, in some examples the lower metal layer $M_x$ may be a silicided polysilicon layer and the upper metal layer $M_{x+1}$ may comprise a first metal interconnect layer, often referred to as metal-1. In such examples, x=0 such that the lower metal layer $M_x=M_0$ and the upper metal layer $M_{x+1}=M_1$ (i.e., metal-1). Further, as used herein, an "interconnect structure," e.g., in the context of the interconnect structure 202 discussed below, may include any type or types of metal layers as defined above.

FIGS. 3A-3J show an example method of forming the example IC structure 200 shown in FIG. 2, including MIM capacitor module 100 and interconnect structure 202. As noted above, in other examples, the interconnect structure 202 may be optional, such that MIM capacitor module 100 may be formed by the process described below without the elements of interconnect structure 202.

Figure 3A:
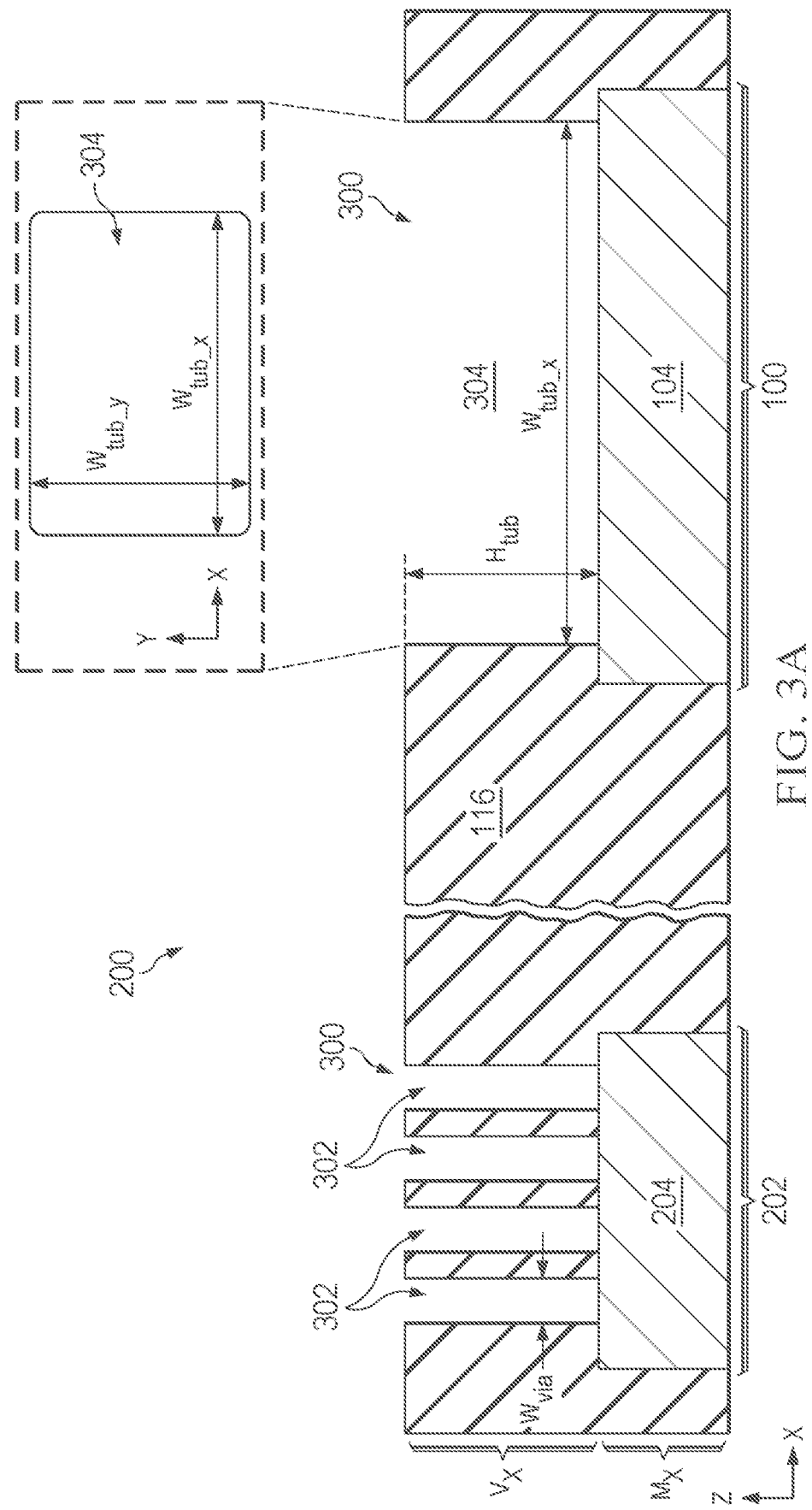
Figure 4:
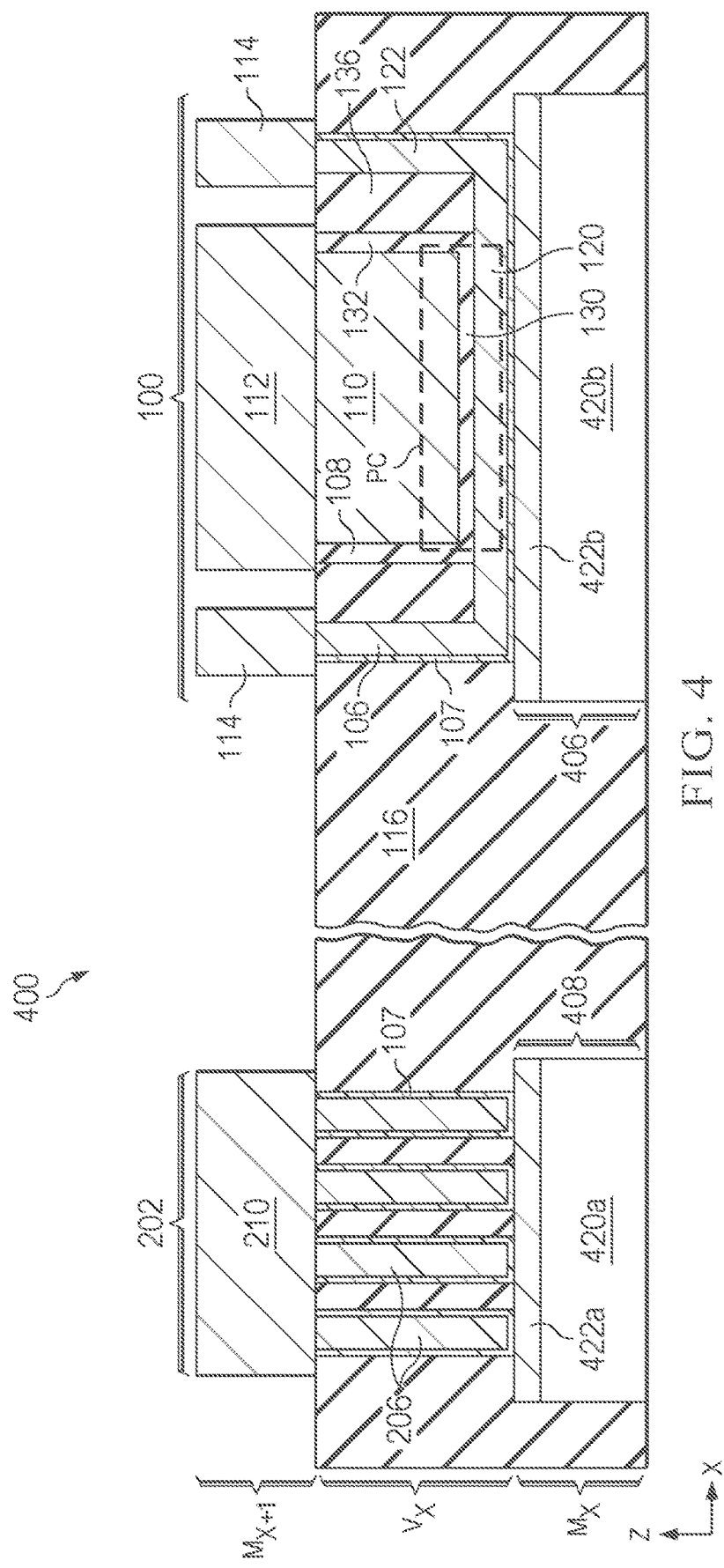
FIG. 4 is a side cross-sectional view showing an example IC structure including an MIM capacitor module and an interconnect structure formed on a lower metal layer comprising a silicided polysilicon layer.

As shown in FIG. 3A, the lower interconnect element 204 and the bottom electrode base 104 are formed in the lower metal layer $M_x$. In this example, the lower metal layer $M_x$ may comprise a metal interconnect layer, wherein the lower interconnect element 204 and bottom electrode base 104 are respectively formed as metal elements (e.g., aluminum elements). In another example, e.g., as shown in FIG. 4 discussed below, the lower metal layer $M_x$ may comprise a silicided polysilicon layer, wherein the lower interconnect element 204 and bottom electrode base 104 respectively comprise a silicide region formed on a respective polysilicon structure.

Dielectric region 116 (e.g., an Inter Metal Dielectrics (IMD) region or Poly Metal Dielectrics (PMD) region) is formed over the lower interconnect element 204 and bottom electrode base 104, which lower interconnect element 204 and bottom electrode base 104 were formed in lower metal layer $M_x$. Dielectric region 116 may include one or more dielectric materials, e.g., silicon oxide, PSG (phosphosilicate glass), or FSG (fluorine doped glass), or a combination thereof.

Via layer openings 300, including interconnect via openings 302 and a tub opening 304, may be patterned (using a photomask) and etched in the dielectric region 116. Via layer openings 300 may be formed using a plasma etch or other suitable etch, followed by a resist strip or other suitable process to remove remaining portions of photoresist material. The etch process to form via layer openings 300 may be a selective etch that stops on lower interconnect element 204 and bottom electrode base 104 (e.g., comprising aluminum or other metal).

Interconnect via openings 302 may be via openings having a width (or diameter or Critical Dimension (CD)) $W_{via}$ in both the x-direction and y-direction in the range of 0.1-0.5 µm, for example.

In contrast, tub opening 304 may have a substantially larger width in the x-direction ($W_{tub\_x}$) and/or y-direction ($W_{tub\_y}$) than interconnect via openings 302. The shape and dimensions of the tub opening 304 may be selected based on various parameters, e.g., for effective manufacturing of the MIM capacitor module 100 (e.g., effective formation of the bottom electrode cup 106, insulator cup 108, dielectric sidewall spacer 136, and top electrode 110 in the tub opening 304) and/or for desired performance characteristics of the resulting MIM capacitor module 100. In one example, e.g., as shown in FIG. 3A, the tub opening 304 may have a square or rectangular shape from the top view. In other examples, tub opening 304 may have a circular or oval shape from the top view.

As noted above, a width of tub opening 304 in the x-direction ($W_{tub\_x}$), y-direction ($W_{tub\_y}$), or both the x-direction and y-direction ($W_{tub\_x}$ and $W_{tub\_y}$) may be substantially larger than the width $W_{via}$ of interconnect via openings 302 in the x-direction, y-direction, or both the x-direction and y-direction. For example, in some examples, width $W_{tub\_x}$ and $W_{tub\_y}$ of tub opening 304 are respectively at least twice as large as the width $W_{via}$ of interconnect via openings 302. In particular examples, width $W_{tub\_x}$ and $W_{tub\_y}$ of tub opening 304 are respectively at least five time as large or at least 10 times as large as the width $W_{via}$ of interconnect via openings 302. In some examples, $W_{tub\_x}$ and $W_{tub\_y}$ are respectively in the range of 1-100 µm.

Further, tub opening 304 may be formed with a height-to-width aspect ratio of less than or equal to 1.0 in both the x-direction and y-direction, e.g., to allow effective filling of the tub opening 304 by conformal materials. For example, tub opening 304 may be formed with aspect ratios $H_{tub}/W_{tub\_x}$ and $H_{tub}/W_{tub\_y}$ respectively in the range of 0.01-1.0, for example in the range of 0.1-1.0. In some examples, aspect ratios $H_{tub}/W_{tub\_x}$ and $H_{tub}/W_{tub\_y}$ are respectively less than or equal to 1.0, e.g., for effective filling of tub opening 304 by various materials to form bottom electrode cup 106, insulator cup 108, dielectric sidewall spacer 136, and top electrode 110 in the tub opening 304. For example, tub opening 304 may be formed with aspect ratios $H_{tub}/W_{tub\_x}$ and $H_{tub}/W_{tub\_y}$ respectively in the range of 0.1-1.0, or more particularly in the range of 0.5-1.0.

Figure 3B:
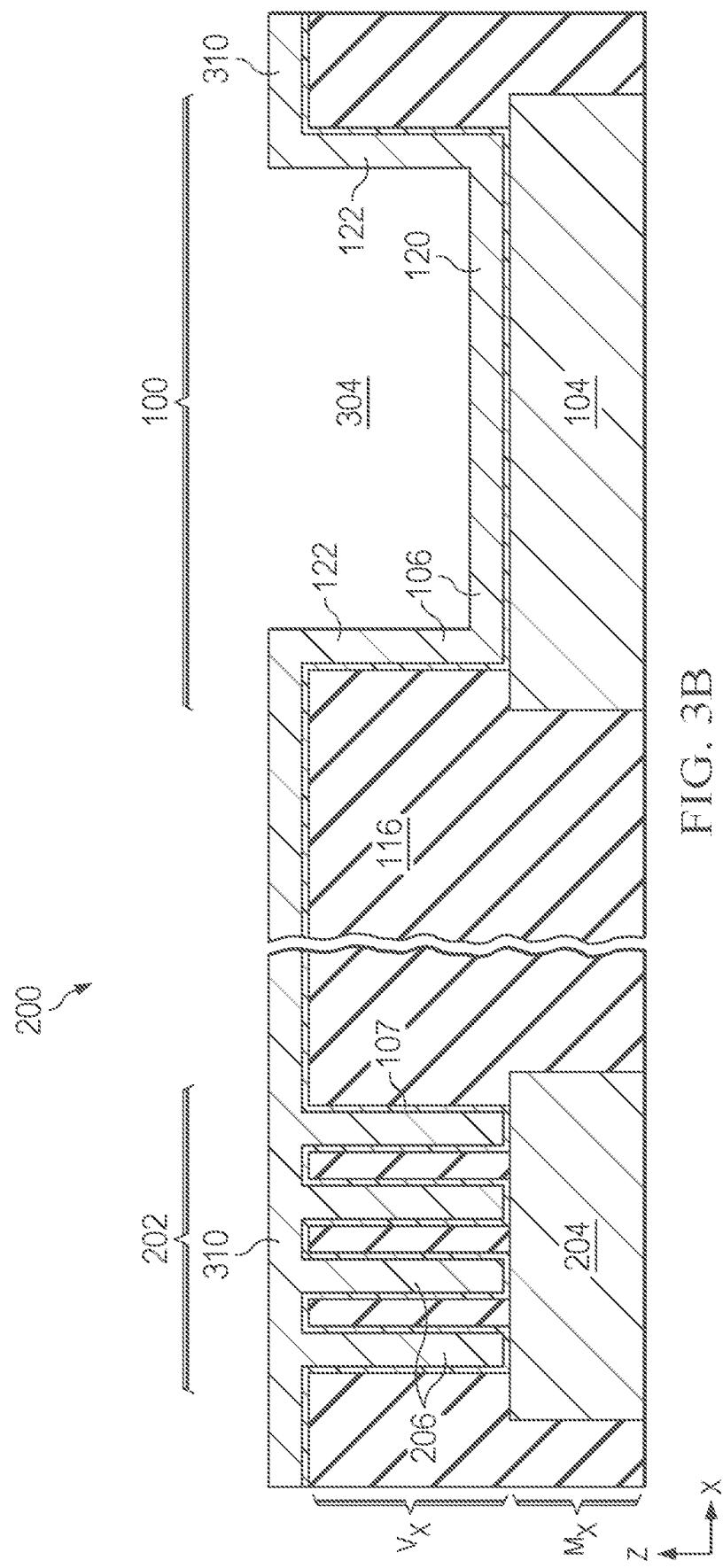

Next, as shown in FIG. 3B, a liner (or "glue layer") 107, e.g., comprising TiN with a thickness in the range of 50 Å-200 Å, is deposited over the structure and extends into respective via layer openings 300. A conformal metal layer 310 is deposited over the liner 107 and extends into respective via layer openings 300 to (a) fill interconnect via openings 302 to form respective interconnect vias 206, and (b) form the bottom electrode cup 106 in the tub opening 304, wherein the bottom electrode cup 106 includes the laterally-extending bottom electrode cup base 120 and the bottom electrode cup sidewall 122 extending upwardly (in the z-direction) from a lateral perimeter edge of the laterally-extending bottom electrode cup base 120. In one example, the conformal metal layer 310 comprises tungsten deposited with a thickness in the range of 1000 Å-5000 Å. In other examples, the conformal metal layer 310 may comprise Co, TiN, or other conformal metal. The conformal metal layer 310 may be deposited by a conformal chemical vapor deposition (CVD) process or other suitable deposition process.

Figure 3C:
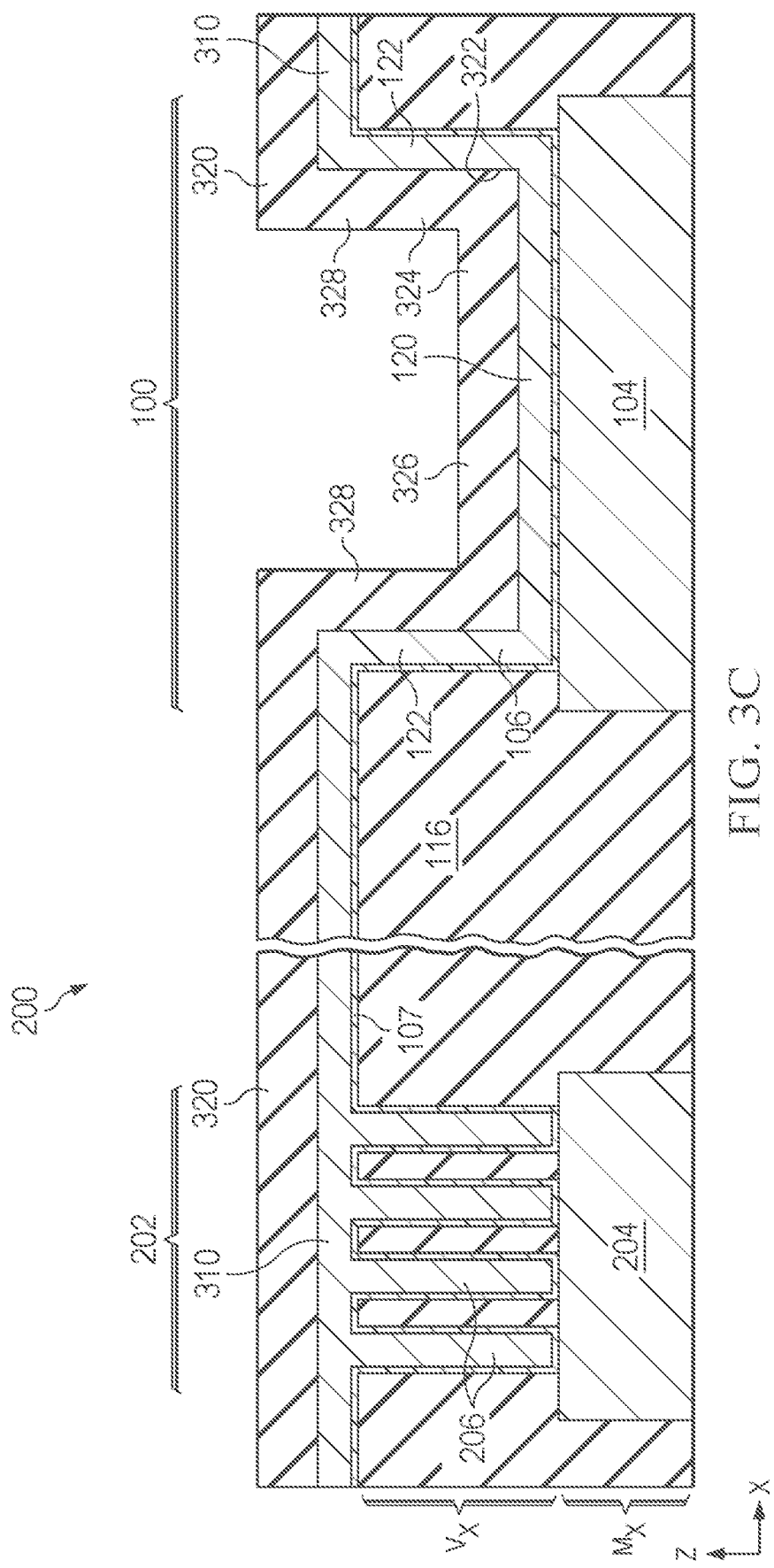

Next, as shown in FIG. 3C, a dielectric spacer layer 320 is deposited over the conformal metal layer 310 and extends into an opening 322 defined by the bottom electrode cup 106, to form a cup-shaped dielectric spacer layer structure 324 in the opening 322. The cup-shaped dielectric spacer layer structure 324 includes (a) a laterally-extending dielectric spacer layer base 326 (formed on the laterally-extending bottom electrode cup base 120) and (b) a dielectric spacer layer sidewall 328 (formed adjacent the bottom electrode cup sidewall 122) extending upwardly from the laterally-extending dielectric spacer layer base 326. In some examples, the dielectric spacer layer 320 comprises a silicon oxide, fluorosilicate glass (FSG), organosilicate glass (OSG), porous OSG, or other low-k dielectric (e.g., having a dielectric constant k less than 4.0), deposited with a thickness in the range of 2000 Å-5000 Å, i.e., wherein the dielectric spacer layer base 326 has a z-direction thickness in the range of 2000 Å-5000 Å and the dielectric spacer layer sidewall 328 has an x-direction thickness, and a y-direction thickness, in the range of 2000 Å-5000 Å.

Figure 3D:
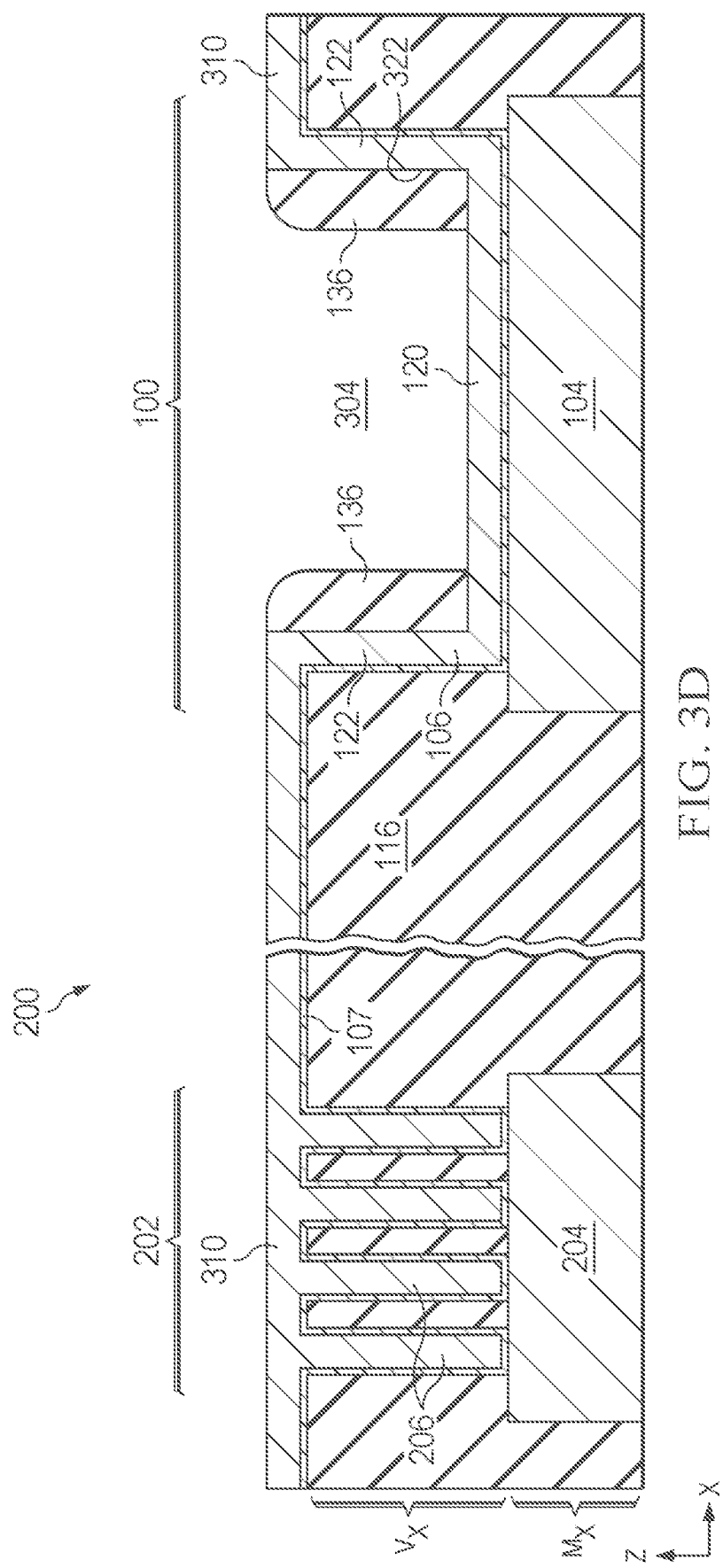

Next, as shown in FIG. 3D, portions of the dielectric spacer layer 320 are etched or otherwise removed to define the dielectric sidewall spacer 136 formed laterally adjacent the bottom electrode cup sidewall 122. In one example, an anisotropic (directional) plasma etch without patterning (e.g., a blanket plasma etch) is performed to remove portions of the dielectric spacer layer 320, including the laterally-extending dielectric spacer layer base 326 and portions of the dielectric spacer layer 320 outside (above) the tub opening 304, leaving the dielectric sidewall spacer 136 on the bottom electrode cup sidewall 122.

Figure 3E:
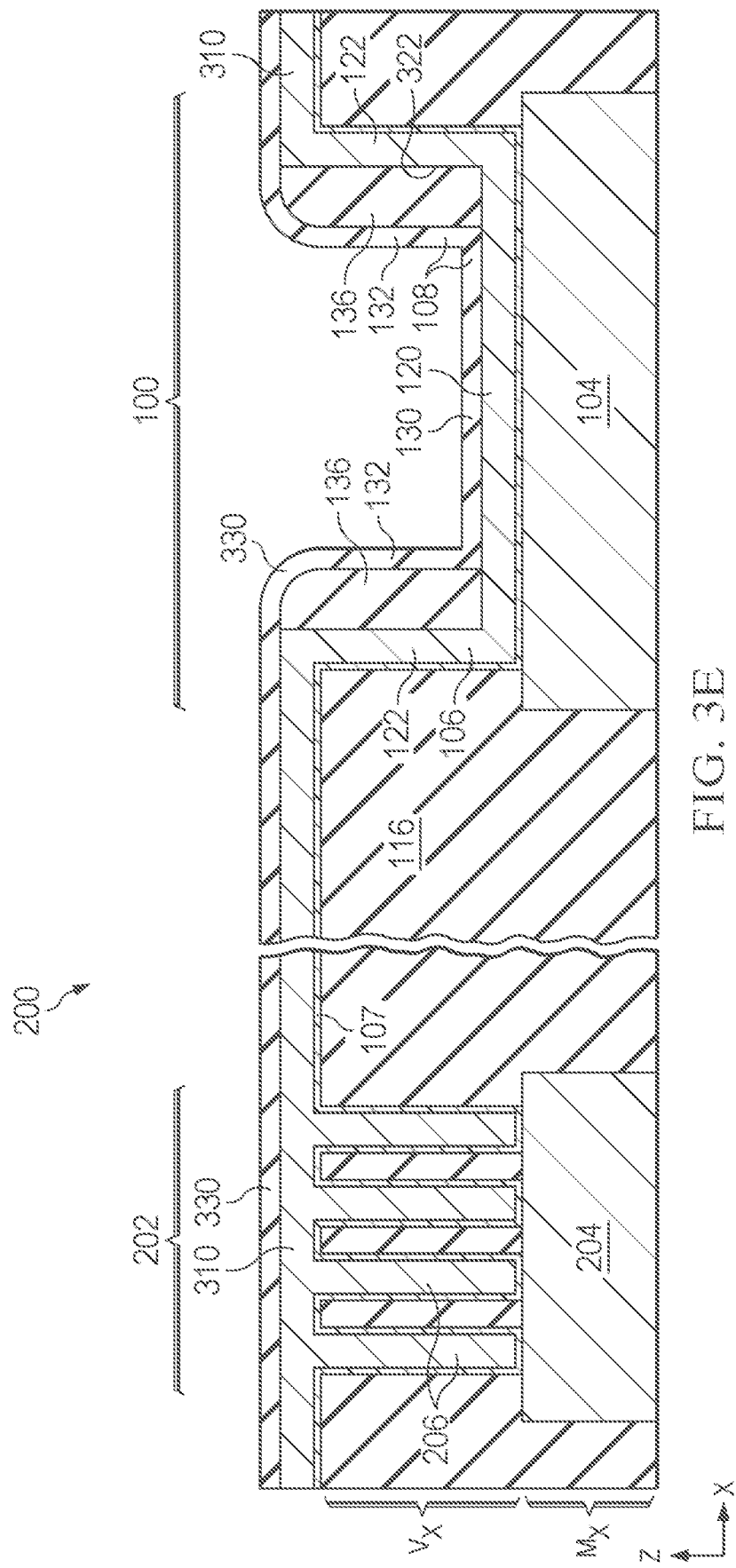

Next, as shown in FIG. 3E, an insulator layer 330 is deposited over the structure and extending down into an opening 332 (defined by the bottom electrode cup base 120 and dielectric sidewall spacer 136) to form the insulator cup 108. The insulator cup 108 includes (a) the laterally-extending insulator cup base 130 formed on the laterally-extending bottom electrode cup base 120 and (b) the insulator cup sidewall 132 extending upwardly from the laterally-extending insulator cup base 130 and formed laterally adjacent the dielectric sidewall spacer 136. In this example, the insulator cup sidewall 132 extends upwardly from a lateral perimeter edge of the laterally-extending insulator cup base 130. Due to the presence of the dielectric sidewall spacer 136, the laterally-extending insulator cup base 130 covers only a partial area of the laterally-extending bottom electrode cup base 120. In some examples, insulator layer 330 comprises silicon nitride (SiN) deposited with a thickness in the range of 250 Å-750 Å by a Plasma Enhanced Chemical Vapor Deposition (PECVD) process. Alternatively, insulator layer 330 may comprise $Al_2O_3$, $ZrO_2$, $HfO_2$, $ZrSiO_x$, $HfSiO_x$, HfAlOx, or $Ta_2O_5$, or other suitable capacitor insulator material deposited using an Atomic Layer Deposition (ALD) process.

Figure 3F:
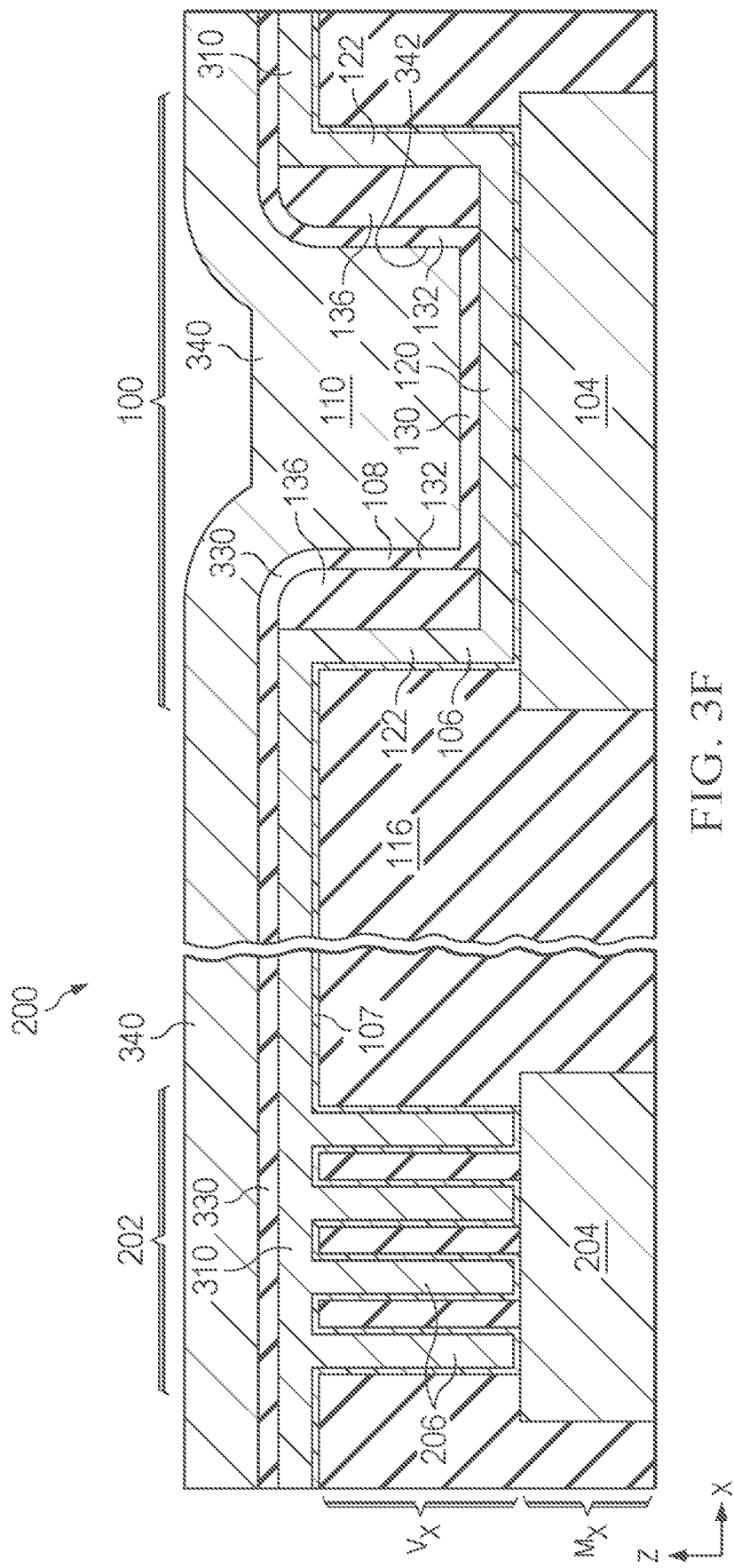

Next, as shown in FIG. 3F, a top electrode layer 340 is deposited over the insulator layer 330 and extends into and fills an opening 342 defined by the insulator cup 108. In some examples, top electrode layer 340 may comprise Al, Ti, TiN, W, or a combination thereof, for example TiN and Al, and may be deposited by a physical vapor deposition (PVD) process.

Next, as shown in FIGS. 3G and 3H, a planarization process, e.g., chemical mechanical planarization (CMP) process, is performed to remove upper portions of the top electrode layer 340, insulator layer 330, and conformal metal layer 310, along with an upper portion of the dielectric sidewall spacer 136. FIG. 3G shows a top view of the resulting structure after the planarization process, and FIG. 3H shows a side cross-sectional view taking through line 3H-3H shown in FIG. 3G. The planarization process defines a final form of the bottom electrode cup 106, insulator cup 108, dielectric sidewall spacer 136, and top electrode 110. The planarization process defines a planarized top surface 350 including a planarized top surface 352 of the top electrode 110 and a planarized top surface 354 of the bottom electrode cup sidewall 122.

As shown in FIG. 3G, the bottom electrode cup sidewall 122, the dielectric sidewall spacer 136, and the insulator cup sidewall 132 have a respective closed-loop rectangular perimeter in the x-y plane. The dielectric sidewall spacer 136 physically separates the insulator cup sidewall 132 from the bottom electrode cup sidewall 122 around the closed-loop rectangular perimeter of the insulator cup sidewall 132.

Also shown in FIG. 3G, interconnect vias 206 may have a circular shape in the x-y plane. In other examples, interconnect vias 206 may have any other shape in the x-y plane, e.g., a square or rectangular shape.

Figure 3I:
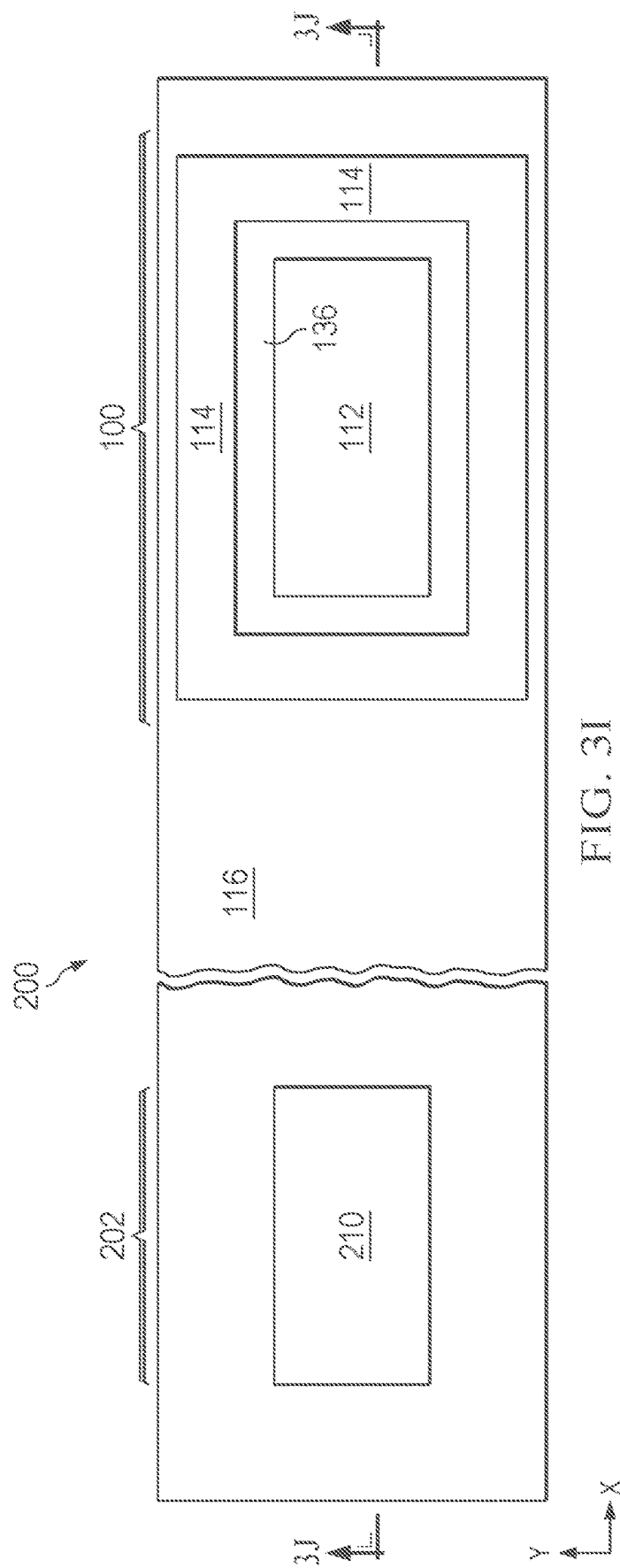
Figure 3J:
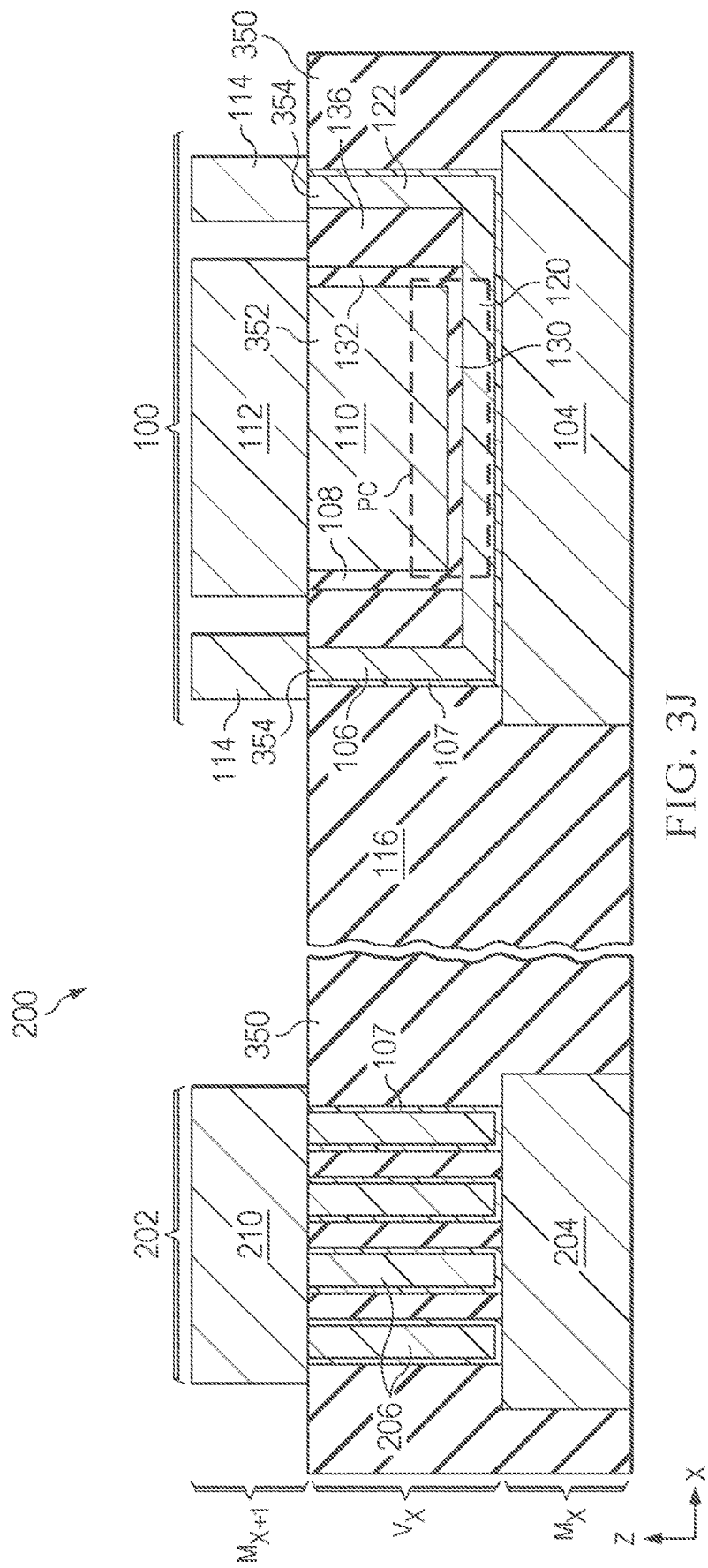

Next, as shown in FIGS. 3I and 3J, an upper metal layer ($M_{x+1}$ layer) may be formed on the planarized upper surface 350 of the via layer $V_x$. FIG. 3I shows a top view of the resulting structure after formation of the upper metal layer, and FIG. 3J shows a side cross-sectional view taking through line 3J-3J shown in FIG. 3I. Various metal elements are formed in the upper metal layer $M_{x+1}$ (e.g., by a metal deposition, pattern, and etch process) including (a) the upper interconnect element 210 connected to interconnect vias 206, (b) the top electrode connection pad 112 connected to the top electrode 110, and (c) the bottom electrode connection pad 114 connected to the bottom electrode cup 106. The upper metal layer $M_{x+1}$ may comprise aluminum or other suitable metal.

As shown, the top electrode connection pad 112 may be formed directly on the planarized top surface 352 of the top electrode 110, and the bottom electrode connection pad 114 may be formed directly on the planarized top surface 354 of the bottom electrode cup sidewall 122. In this example, as shown in FIG. 3G, the bottom electrode connection pad 114 has a closed-loop rectangular shape extending around a perimeter of the top electrode connection pad 112 in the x-y plane, and separated from the perimeter of the top electrode connection pad 112 by dielectric sidewall spacer 136, which similarly has a closed-loop rectangular shape extending around a perimeter of the top electrode connection pad 112 in the x-y plane. As discussed above, the presence of the dielectric sidewall spacer 136 to space the insulator cup sidewall 132 away from the bottom electrode cup sidewall 122 (in the x-y plane) allows both the top electrode connection pad 112 and bottom electrode connection pad 114 to be formed in the same upper metal layer ($M_{x+1}$ layer) and directly on top of the top electrode 110 and bottom electrode cup sidewall 122, respectively.

FIG. 4 is a side cross-sectional view showing an example IC structure 400 including an MIM capacitor module 402 and an interconnect structure 404 formed on a lower metal layer $M_x$ comprising a silicided polysilicon layer. In this example, a lower interconnect element 408 of interconnect structure 404 and a bottom electrode base 406 of the MIM capacitor module 402 may each comprises a metal silicide region formed on a respective polysilicon region. In particular, the lower interconnect element 408 comprises a first metal silicide region 422*a* formed on a first polysilicon region 420*a*, and bottom electrode base 406 comprises a second metal silicide region 422*b* formed on a second polysilicon region 420*b*.

The invention claimed is:

1. A metal-insulator-metal (MIM) capacitor module, comprising:
    a bottom electrode cup including:
        a laterally-extending bottom electrode cup base; and
        a bottom electrode cup sidewall extending upwardly from the laterally-extending bottom electrode cup base;
    an insulator cup formed in an opening defined by the bottom electrode cup, the insulator cup including:
        a laterally-extending insulator cup base formed over the laterally-extending bottom electrode cup base; and
        an insulator cup sidewall extending upwardly from the laterally-extending insulator cup base;
    a dielectric sidewall spacer between the insulator cup sidewall and the bottom electrode cup sidewall; and
    a top electrode formed in an opening defined by the insulator cup;
    wherein the dielectric sidewall spacer defines a separation distance between the insulator cup sidewall and the bottom electrode cup sidewall greater than a separation distance between the laterally-extending insulator cup base and the laterally-extending bottom electrode cup base, thereby defining a capacitive coupling between the top electrode and the bottom electrode cup sidewall smaller than a capacitive coupling between the top electrode and the laterally-extending bottom electrode cup base.

2. The MIM capacitor module of claim 1, wherein the laterally-extending insulator cup base covers only a partial area of the laterally-extending bottom electrode cup base.

3. The MIM capacitor module of claim 1, comprising:
    a bottom electrode base formed in a lower metal layer, wherein the bottom electrode cup is formed on the bottom electrode base; and
    a top electrode connection pad formed in an upper metal layer and conductively connected to the top electrode.

4. The MIM capacitor module of claim 3, wherein the lower metal layer and the upper metal layer comprise respective interconnect metal layers.

5. The MIM capacitor module of claim 3, wherein the bottom electrode base comprises a metal silicide layer formed on a polysilicon structure.

6. The MIM capacitor module of claim 1, comprising a top electrode connection pad and a bottom electrode connection pad formed in an upper metal layer;
- wherein the top electrode connection pad is conductively connected to the top electrode; and
- wherein the bottom electrode connection pad is laterally spaced apart from the top electrode connection pad and conductively connected to the bottom electrode cup.

7. The MIM capacitor module of claim 6, wherein the bottom electrode connection pad defines a closed-loop shape that surrounds the top electrode connection pad.

8. The MIM capacitor module of claim 1, wherein the dielectric sidewall spacer comprises oxide, fluorosilicate glass (FSG), organosilicate glass (OSG), or porous OSG.

9. The MIM capacitor module of claim 1, wherein the dielectric sidewall spacer has a lateral thickness in the range of 2000 Å-5000 Å.

10. The MIM capacitor module of claim 1, wherein the dielectric sidewall spacer comprises a portion of a dielectric layer, and wherein the dielectric layer does not extend between the top electrode and the laterally-extending bottom electrode cup base.

11. An integrated circuit structure, comprising:
- an interconnect structure comprising:
  - a lower interconnect element formed in a lower metal layer;
  - an upper interconnect element formed in an upper metal layer; and
  - an interconnect via formed in a dielectric region between the lower metal layer and the upper metal layer lower; and
- a metal-insulator-metal (MIM) capacitor module comprising:
  - a bottom electrode cup formed in the dielectric region, the bottom electrode cup including:
    - a laterally-extending bottom electrode cup base; and
    - a bottom electrode cup sidewall extending upwardly from the laterally-extending bottom electrode cup base,
  - an insulator cup formed in an opening defined by the bottom electrode cup, the insulator cup including:
    - a laterally-extending insulator cup base formed over the laterally-extending bottom electrode cup base; and
    - an insulator cup sidewall extending upwardly from the laterally-extending insulator cup base;
  - a dielectric sidewall spacer between the insulator cup sidewall and the bottom electrode cup sidewall; and
  - a top electrode formed in an opening defined by the insulator cup.

12. The integrated circuit structure of claim 11, comprising a bottom electrode base formed in the lower metal layer;
- wherein the laterally-extending bottom electrode cup base is formed on the bottom electrode base.

13. The integrated circuit structure of claim 11, comprising a top electrode connection pad formed in the upper metal layer and conductively connected to the top electrode.

14. The integrated circuit structure of claim 13, comprising a bottom electrode connection pad formed in the upper metal layer and spaced apart from the top electrode connection pad, wherein the bottom electrode connection pad is conductively connected to the bottom electrode cup.

15. The integrated circuit structure of claim 13, wherein the lower metal layer and the upper metal layer respectively comprise interconnect metal layers.

16. The integrated circuit structure of claim 11, comprising a bottom electrode base formed in the lower metal layer; wherein the lower metal layer comprises a silicided polysilicon layer, wherein the lower interconnect element and the bottom electrode base comprise a respective metal silicide layer formed on a respective polysilicon structure.

17. The integrated circuit structure of claim 11, wherein the dielectric sidewall spacer defines a separation distance between the insulator cup sidewall and the bottom electrode cup sidewall greater than a separation distance between the laterally-extending insulator cup base and the laterally-extending bottom electrode cup base, thereby defining a capacitive coupling between the top electrode and the bottom electrode cup sidewall smaller than a capacitive coupling between the top electrode and the laterally-extending bottom electrode cup base.

18. A metal-insulator-metal (MIM) capacitor module, comprising:
- a bottom electrode base formed in a lower metal layer;
- a bottom electrode cup formed on the bottom electrode base, the bottom electrode cup including:
  - a laterally-extending bottom electrode cup base; and
  - a bottom electrode cup sidewall extending upwardly from the laterally-extending bottom electrode cup base;
- an insulator cup formed in an opening defined by the bottom electrode cup, the insulator cup including:
  - a laterally-extending insulator cup base formed over the laterally-extending bottom electrode cup base; and
  - an insulator cup sidewall extending upwardly from the laterally-extending insulator cup base;
- a dielectric sidewall spacer between the insulator cup sidewall and the bottom electrode cup sidewall;
- a top electrode formed in an opening defined by the insulator cup; and
- a top electrode connection pad formed in an upper metal layer and conductively connected to the top electrode.

19. The MIM capacitor module of claim 18, wherein the lower metal layer and the upper metal layer comprise respective interconnect metal layers.

20. The MIM capacitor module of claim 18, wherein the bottom electrode base comprises a metal silicide layer formed on a polysilicon structure.

21. The MIM capacitor module of claim 18, wherein the dielectric sidewall spacer defines a separation distance between the insulator cup sidewall and the bottom electrode cup sidewall greater than a separation distance between the laterally-extending insulator cup base and the laterally-extending bottom electrode cup base, thereby defining a capacitive coupling between the top electrode and the bottom electrode cup sidewall smaller than a capacitive coupling between the top electrode and the laterally-extending bottom electrode cup base.

22. A metal-insulator-metal (MIM) capacitor module, comprising:
- a bottom electrode cup including:
  - a laterally-extending bottom electrode cup base; and
  - a bottom electrode cup sidewall extending upwardly from the laterally-extending bottom electrode cup base;
- an insulator cup formed in an opening defined by the bottom electrode cup, the insulator cup including:
  - a laterally-extending insulator cup base formed over the laterally-extending bottom electrode cup base; and
  - an insulator cup sidewall extending upwardly from the laterally-extending insulator cup base;
- a dielectric sidewall spacer between the insulator cup sidewall and the bottom electrode cup sidewall;

a top electrode formed in an opening defined by the insulator cup; and a top electrode connection pad and a bottom electrode connection pad formed in an upper metal layer;

wherein the top electrode connection pad is conductively connected to the top electrode; and wherein the bottom electrode connection pad is laterally spaced apart from the top electrode connection pad and conductively connected to the bottom electrode cup.

23. The MIM capacitor module of claim 22, wherein the bottom electrode base comprises a metal silicide layer formed on a polysilicon structure.

24. The MIM capacitor module of claim 22, wherein the dielectric sidewall spacer defines a separation distance between the insulator cup sidewall and the bottom electrode cup sidewall greater than a separation distance between the laterally-extending insulator cup base and the laterally-extending bottom electrode cup base, thereby defining a capacitive coupling between the top electrode and the bottom electrode cup sidewall smaller than a capacitive coupling between the top electrode and the laterally-extending bottom electrode cup base.

\* \* \* \* \*